United States Patent [19]

Kirkland et al.

[11] Patent Number: 6,059,875
[45] Date of Patent: May 9, 2000

[54] METHOD OF EFFECTING NITROGEN DOPING IN CZOCHRALSKI GROWN SILICON CRYSTAL

[75] Inventors: Scott M. Kirkland, Portland, Oreg.; Oleg V. Kononchuk, Brush Prairie; Akihiko Tamura, Vancouver, both of Wash.

[73] Assignee: Seh America, Inc., Vancouver, Wash.

[21] Appl. No.: 09/227,896

[22] Filed: Jan. 11, 1999

[51] Int. Cl.$^7$ ..................................................... C30B 15/00
[52] U.S. Cl. ................................ 117/13; 117/19; 117/21; 117/36
[58] Field of Search ................................ 117/13, 19, 21, 117/36

[56] References Cited

U.S. PATENT DOCUMENTS

| | | |
|---|---|---|
| 4,090,851 | 5/1978 | Berkman et al. . |
| 4,400,232 | 8/1983 | Ownby et al. . |
| 4,415,401 | 11/1983 | Wald et al. . |
| 4,443,411 | 4/1984 | Kalejs . |
| 4,591,409 | 5/1986 | Ziem et al. . |

FOREIGN PATENT DOCUMENTS

| | | | |
|---|---|---|---|
| 5-294780 | 11/1993 | Japan | .............................. C30B 15/02 |

OTHER PUBLICATIONS

Askeland, The Science and Engineering of Materials, 2nd Ed., PWS–Kent, pp. 483–484, 500, 1989.

Xiwen Zhang et al., "Effect of Iron on Oxygen Precipitation in Nitrogen–Doped Czochralski Silicon", Journal of Applied Physics, vol. 84, No. 10, Nov. 15, 1998, pp. 5502–5505.

Huanming Lu et al., "Thermal Warpage of Czochralski Silicon Wafers Grown Under a Nitrogen Ambience", Phys. Stat. Sol. (a) 169,1998, pp. 193–198.

D. Gräf et al., "Characterization of Crystal Quality by Delineation of COP and the Impact on the Silicon Wafer Surface", The Electrochemical Society, Oct. 1996, 16 pages.

Koji Sumino et al., "Effects of Nitrogen on Dislocation Behavior and Mechanical Strength in Silicon Crystals", Journal of Applied Physics, vol. 54, No. 9, Sep. 1983, pp. 5016–5020.

C. S. Chen et al., "Crystal", Journal of Applied Physics, vol. 76, No. 6, Sep. 15, 1994, pp. 3347–3351.

T. Abe et al., "The Characteristics of Nitrogen in Silicon Crystals", VLSI Science and Technology, 1985, pp. 543–549.

Herman J. Stein, "Nitrogen in Crystalline Si", Materials Research Society Symp. Proc., vol. 59, 1986, pp. 523–535.

F. Shimura et al., "Nitrogen Effect on Oxygen Precipitation in Czochralski Silicon", Appl. Phys. Lett., vol. 48, No. 3, Jan. 20, 1986, pp. 224–226.

*Primary Examiner*—Benjamin L. Utech
*Assistant Examiner*—Matt Anderson
*Attorney, Agent, or Firm*—Oliff & Berridge, PLC

[57] ABSTRACT

A method of introducing nitrogen into a melt for use in producing a nitrogen-doped silicon single crystal by the Czochralski method includes adding a silicon material to a vessel, such as a quartz crucible, adding a nitrogen-containing powder, preferably silicon nitride powder, to the vessel, and heating the vessel for a time sufficient to melt the silicon material and to dissolve the nitrogen-containing in the silicon material in order to form the melt. A nitrogen-doped silicon single crystal is then produced from the melt by the Czochralski method by pulling the silicon single crystal from the melt with a seed crystal.

17 Claims, No Drawings

METHOD OF EFFECTING NITROGEN DOPING IN CZOCHRALSKI GROWN SILICON CRYSTAL

BACKGROUND OF THE INVENTION

1. Field of the Invention

This invention relates to a method of doping a silicon single crystal with nitrogen. More in particular, the invention relates to the addition of a nitrogen-containing powder into a melt that is used to prepare a silicon single crystal by the Czochralski method, the powder being the source of nitrogen dopant in the silicon single crystal.

2. Discussion of Related Art

The effects of nitrogen doping of silicon single crystals have been studied in the art. It is believed that silicon single crystals may be beneficially doped with nitrogen in order to enhance the formation of oxygen precipitates which act as gettering sites within the crystal, and to strengthen the crystal.

Shimura et al., "Nitrogen Effect on Oxygen Precipitation in Czochralski Silicon", Appl. Phys. Lett., vol. 48, no. 3 (Jan. 20, 1986), reported on the enhancement of oxygen precipitation in Czochralski (Cz) grown silicon wafers. It is proposed that the incorporation of nitrogen into substitutional sites generates stable microdefects in the crystal in order to enhance the oxygen precipitation. The method of doping the crystal with nitrogen is not specifically described, the reference stating only that the melt from which the silicon single crystal was grown contained 20 ppma nitrogen. How the nitrogen is introduced into the melt is not described.

Sumino et al., "Effects of Nitrogen on Dislocation Behavior and Mechanical Strength in Silicon Crystals", J. Appl. Phys., vol. 54, no. 9 (September 1983), reported that in floating-zone (FZ) grown silicon crystals, the presence of interstitial nitrogen atoms brings about a hardening of the silicon crystal through the locking of dislocations. In this regard, it is reported that nitrogen atoms thus may act in the same manner as oxygen atoms in locking crystal dislocations. The crystal was doped with nitrogen by growing the crystal in an environment of a mixed gas of argon and nitrogen.

Gräf et al., "Characterization of Crystal Quality by Delineation of COP and the Impact on the Silicon Wafer Surface", Symposium on High Purity Silicon IV at the 190$^{th}$ Meeting of The Electrochemical Society (Oct. 6–11, 1996), reported on the size and distribution of crystal related defects in silicon prepared by the floating-zone technique. It is indicated that the number of crystal originated particles (COP) detected in the crystal decrease with nitrogen doping for a given oxygen concentration, thus indicating an involvement of oxygen in COP formation. Nitrogen doping techniques are not described.

Chen et al., J. Appl. Phys., vol. 76, no. 6 (Sep. 15, 1994), reported on the study of the formation of nitrogen-oxygen donors in nitrogen doped Cz grown silicon single crystals. The reference studied Cz silicon crystals doped with nitrogen by growing the crystals in an atmosphere of nitrogen. The background section refers to other studies of Cz silicon crystals doped with nitrogen that were formed by adding silicon nitride ($Si_3N_4$) to the silicon melt. The form of the silicon nitride used in these other references is not described in this reference.

Abe et al., "The Characteristics of Nitrogen in Silicon Crystals", VLSI Science and Technology, W. M. Bullis and S. Broys, Eds. (1985), reported that nitrogen doping of silicon crystals showed a stronger dislocation locking compared to non-doped crystals, and that nitrogen atoms interact strongly with oxygen impurities and act as nucleation centers of oxygen precipitation. For Cz grown silicon crystals, the nitrogen was introduced by adding silicon nitride to the melt, although the specifics of the method, including the form of the silicon nitride added to the melt, are not described.

Stein, "Nitrogen in Crystalline Si", Mat. Res. Soc. Symp. Proc., vol. 59 (1986), summarizes effects of nitrogen and nitrogen-impurity interactions in crystalline silicon. It is reported that several techniques for introducing nitrogen into the silicon single crystal may be used, including nitrogen doping in the melt, forming the crystal in nitrogen gas atmospheres and nitrogen ion implantation into a formed silicon single crystal.

As noted in the references discussed above, the introduction of nitrogen into a silicon single crystal formed by the Czochralski method may be effected by several techniques, including the direct introduction of nitride materials into the melt from which the silicon single crystal is formed. As explained in U.S. Pat. No. 4,591,409, this is done by utilizing a quartz crucible lined with the nitrogen-containing material, for example, a quartz crucible lined with a silicon nitride liner. See also U.S. Pat. No. 4,090,851, describing a silicon nitride coated crucible for use in the formation of silicon single crystals. The addition of silicon wafers coated with silicon nitride to the melt may also be possible.

Known techniques for doping Cz grown silicon single crystals with nitrogen have problems, including that the methods require extra processing steps and are expensive. The preparation of silicon nitride coated crucibles and silicon nitride coated wafers involves extra processing steps which adds cost to the manufacturing process. However, these techniques are believed to be required in order to effectively dope the silicon single crystal with nitrogen in view of the fact that silicon nitride does not readily dissolve in the silicon melt. The use of nitrogen atmospheres requires special equipment and is expensive. The use of nitrogen ion implantation involves extra processing steps following formation of the silicon single crystal.

What is desired is an inexpensive method for nitrogen doping of Cz grown silicon single crystals that eliminates the need for extra processing steps.

SUMMARY OF THE INVENTION

It is an object of the present invention to develop a quick, easy and inexpensive method of introducing a nitrogen dopant into a melt to be used in forming a Czochralski grown silicon single crystal. It is a further object of the present invention to develop a method of doping a Czochralski grown silicon single crystal with nitrogen.

These and other objects are achieved by a method of preparing a melt for producing a Czochralski grown silicon single crystal in which a nitrogen-containing powder is added to the melt as the source of nitrogen dopant. These and other objects are also achieved by a method of doping a silicon single crystal with nitrogen, comprising obtaining a melt as discussed above and pulling the silicon single crystal from the melt with a seed crystal.

DETAILED DESCRIPTION OF PREFERRED EMBODIMENTS

The process of the invention introduces nitrogen into a silicon melt from which a silicon single crystal is grown by the Czochralski method. The nitrogen introduced into the melt is doped into the silicon single crystal pulled from the melt.

The Czochralski method of forming silicon single crystals is a well known method in the art. The method involves forming a melt of a silicon material, dipping a seed crystal into the melt, and withdrawing the seed crystal at a rate sufficient to grow the silicon single crystal at a desired diameter.

Apparatuses for forming silicon single crystals by the Czochralski method are well known in the art. The exact structure of the apparatus forms no part of the present invention, and any such apparatus may suitably be used. A common feature among such apparatuses is the use of a vessel, i.e., a container of any shape or size that is able to contain the melt charge, that contains the melt charge from which the crystal is pulled. The vessel is typically a crucible, most typically a quartz crucible.

In forming the melt for use in the growing of a silicon single crystal by the Czochralski method, the main component of a melt charge is polycrystalline silicon. The polycrystalline silicon may be added to the vessel in any suitable form. For example, the polycrystalline silicon may be added to the vessel as chunk silicon, for example as formed by the Siemens method, or as granular silicon, for example as formed by a fluidized bed reaction method.

In the present invention, a source of nitrogen dopant is added to the vessel in powder form. Any suitable nitrogen-containing powder may be used as the source of nitrogen, including compounds and salts of nitrogen, although most preferably the powder is silicon nitride powder.

The powder may have any suitable size. However, there appears to be a correlation between the powder size and the amount of time required to completely dissolve the powder into the melt. Ideally, when using silicon nitride as the powder, it preferably has a size of less than or equal to 3 mm in diameter.

The powder is preferably added to the melt charge in an amount such that the resultant silicon single crystal pulled from the melt charge has a nitrogen concentration of from, for example, $1\times10^{10}$ N/cm$^3$ to $5\times10^{15}$ N/cm$^3$, most preferably of from $1\times10^{14}$ N/cm$^3$ to $5\times10^{15}$ N/cm$^3$. If the amount of nitrogen dopant is too low, the desirable effects of nitrogen addition discussed above may not be realized, whereas if the amount of nitrogen dopant is too high, it may adversely affect the crystalline integrity of the silicon single crystal achieved. The amount of powder to be added to achieve these amounts of nitrogen in the resultant crystal can be readily determined by practitioners in the art.

The nitrogen-containing powder may be added to the vessel prior to any heating and melting of the polycrystalline silicon material added to the vessel. While this is the preferred method in terms of ease of processing and efficiency, it is also possible to add the nitrogen-containing powder during the heating process, i.e., after heating of the melt charge has begun, including after complete melting of the silicon has occurred. In other words, the powder may simply be added to molten polycrystalline silicon prior to pulling of the crystal in a so-called "re-doping" procedure.

In addition to the polycrystalline silicon and nitrogen-containing powder, additional conventional dopants may also be added to the melt charge in the vessel. The optional additional dopant may be such that the silicon single crystal produced is of either the p or n type. Such dopants include, for example, the typical Ill–V Group dopants, including boron, phosphorus, antimony, arsenic and the like, and the metallic salts thereof. If an additional dopant is added, it is preferably added in an amount such that the silicon single crystal produced contains the dopant in a concentration of from, for example, about $1\times10^{14}$ to about $2\times10^{19}$ atoms/cm$^3$. These optional additional dopants may also be introduced into the crystal by any other suitable known method.

Once melting of the melt charge is complete and dissolution of the silicon nitride powder into the melt has been achieved, pulling of the crystal is commenced. The pulling of the crystal may proceed under any suitable conditions used in the art with respect to the growing of silicon single crystals by the Czochralski method. The crystal may be pulled so as to have a crystal orientation of any suitable type, including, for example, 100 or 111.

For example, in a typical Cz method, the seed crystal is moved down towards the melt until the lower end of the seed crystal is immersed in the melt. The seed crystal is then upwardly withdrawn at a controlled rate that permits growth of the silicon single crystal at a desired diameter.

During the pulling, the temperature of the melt and the temperature of the seed crystal are maintained at equilibrium. This temperature is typically about, for example, 1,420° C. to 1,450° C. The rotational speed of the vessel containing the melt and the rotational speed of the seed crystal are also both carefully controlled and maintained. Typically, the seed crystal is rotated in a direction opposite to that of the melt. The rotational speeds of the seed crystal and melt may be different, but must be carefully maintained. Rotational speeds of the seed crystal and melt may be independently set so as to be, for example, 1 to 40 revolutions per minute.

During the pulling of the silicon single crystal, the inert gas atmosphere is maintained by flowing the inert gas through the chamber in a smooth, non-turbulent manner. The velocity of the inert gas through the chamber is preferably controlled so as to be at a rate sufficient to remove impurities such as silicon monoxide that may typically be formed during the crystal pulling process. The flowing gas may also be used in controlling the oxygen concentration in the silicon single crystal, as understood in the art.

The silicon single crystal achieved is an ingot in rod form that is doped with nitrogen and any other optional dopants added. The nitrogen-doped ingot may be formed into silicon wafers by typical methods used in the art, including, for example, slicing the wafers from the ingot in desired thicknesses, followed optionally by any of grinding, lapping, etching, polishing, heat treating, cleaning, etc.

The process of the invention achieves an inexpensive and efficient method of doping a silicon single crystal with nitrogen.

EXAMPLE

It has been confirmed through comparison of theoretically calculated nitrogen concentration in the crystal and actually measured nitrogen concentration that the silicon nitride material is dissolved in the melt and incorporated into the silicon single crystal.

A 60 kg charge of polycrystalline silicon is placed in an 18 inch hot zone in an inert argon atmosphere. Silicon nitride powder is added in the amount of 0.58 g to reach an estimated seed end crystal concentration of $3.0\times10^{14}$ atoms/cm$^3$. A 6 inch crystal is successfully grown, and presence of nitrogen in the crystal is confirmed by FTIR (Fourier Transform Infra-Red).

What is claimed is:

1. A method of preparing a melt for producing a silicon single crystal by the Czochralski technique, the method comprising adding a silicon material to a vessel, adding a single powder consisting essentially of a compound or salt of nitrogen to the vessel, optionally with a dopant, and heating the vessel for a time sufficient to melt the silicon material and to dissolve the powder in the silicon material to form the melt.

2. The method according to claim 1, wherein the powder comprises silicon nitride.

3. The method according to claim 1, wherein the silicon material is polycrystalline silicon.

4. The method according to claim 1, wherein the powder is added in an amount such that a Czochralski grown silicon single crystal grown from the melt contains from $1 \times 10^{10}$ $N/cm^3$ to $5 \times 10^{15}$ $N/cm^3$.

5. The method according to claim 1, wherein the process further comprises adding a III–V Group dopant to the vessel.

6. The method according to claim 1, wherein the powder consists essentially of silicon nitride.

7. A method of doping a silicon single crystal, grown by the Czochralski technique, with nitrogen, comprising adding a silicon material to a vessel, adding a single powder consisting essentially of a compound or salt of nitrogen to the vessel, optionally with a dopant, heating the vessel for a time sufficient to melt the silicon material and to dissolve the powder in the silicon material to form the melt, and pulling the silicon single crystal doped with nitrogen from the melt with a seed crystal.

8. The method according to claim 7, wherein the powder comprises silicon nitride.

9. The method according to claim 7, wherein the silicon material is polycrystalline silicon.

10. The method according to claim 7, wherein the powder is added in an amount such that the silicon single crystal pulled from the melt contains from $1 \times 10^{10}$ $N/cm^3$ to $5 \times 10^{15}$ $N/cm^3$.

11. The method according to claim 7, wherein the process further comprises adding a III–V Group dopant to the vessel.

12. The method according to claim 7, wherein the powder is added to the vessel prior to heating.

13. The method according to claim 7, wherein the powder is added to the vessel during the heating.

14. The method according to claim 7, wherein the powder consists essentially of silicon nitride.

15. A method of doping a silicon single crystal, grown by the Czochralski technique, with nitrogen, comprising dissolving a single powder consisting essentially of a compound or salt of nitrogen in a molten silicon material to form a melt, and pulling the silicon single crystal doped with nitrogen from the melt with a seed crystal.

16. The method according to claim 13, wherein the powder comprises silicon nitride.

17. The method according to claim 15, wherein the powder consists essentially of silicon nitride.

* * * * *